United States Patent [19]
Christensen

[11] Patent Number: 5,800,611
[45] Date of Patent: Sep. 1, 1998

[54] METHOD FOR MAKING LARGE AREA SINGLE CRYSTAL SILICON SHEETS

[76] Inventor: Howard Christensen, 171 E. Third Ave. #701, Salt Lake City, Utah 84103

[21] Appl. No.: 925,251

[22] Filed: Sep. 8, 1997

[51] Int. Cl.$^6$ ............................................. C30B 7/00
[52] U.S. Cl. ............................. 117/68; 117/70; 117/7; 264/657; 264/650; 264/669; 264/653; 501/154
[58] Field of Search ..................... 117/922, 930, 117/931, 902, 924, 101, 68, 70, 7; 264/657, 650, 669, 653; 501/154

[56] References Cited

U.S. PATENT DOCUMENTS

| | | | |
|---|---|---|---|
| 2,358,211 | 9/1944 | Christensen et al. | 201/76 |
| 4,102,765 | 7/1978 | Fey et al. | 204/164 |
| 4,102,766 | 7/1978 | Fey et al. | 204/164 |
| 4,102,767 | 7/1978 | Mazelsky et al. | 204/164 |
| 4,131,659 | 12/1978 | Authier et al. | 264/25 |
| 4,830,703 | 5/1989 | Matsutani | 156/617.1 |

*Primary Examiner*—R. Bruce Breneman
*Assistant Examiner*—Evelyn A. Defilló
*Attorney, Agent, or Firm*—Mallinckrodt & Mallinckrodt

[57] ABSTRACT

A single crystal silicon sheet is formed from a polycrystalline sheet by melting a relatively small portion of the sheet at an initial location and defining a single crystallographic orientation for the silicon by placing a small silicon seed crystal in contact with the melted silicon at the initial location. The melted portion is then moved from the initial location throughout the sheet to move impurities in the sheet to the edges of the sheet and to extend the crystallographic orientation of the silicon established at the initial location to the whole sheet, inwardly of the edges. The edges containing impurities and any remaining polycrystalline structure are removed to produce a sheet of single crystal silicon. A polycrystalline sheet may be formed by spreading a slurry of a silicon powder, a binder, and solvent on a surface and allowing the solvent to evaporate to form a sheet. The sheet is moistened to cause it to expand and sheer clear of the surface. The sheet is placed in a support frame or on a support surface and is heated to deploymerize the binder. The sheet is then preferably heated further to at least partially sinter the sheet into a polycrystalline sheet which is then zone refined by moving a melt area throughout the sheet as indicated to convert it from a polycrystalline sheet to a sheet of single crystal silicon.

22 Claims, 1 Drawing Sheet

METHOD FOR MAKING LARGE AREA SINGLE CRYSTAL SILICON SHEETS

BACKGROUND OF THE INVENTION

1. Field

The invention is in the field of producing single crystal silicon sheets.

2. State of the Art

Single crystal silicon wafers are extensively used in the manufacture of semiconductor devices. These wafers are generally sliced from an elongate single crystal body of silicon up to about ten inches in diameter that has been grown by slowly withdrawing a silicon seed crystal from a container of molten silicon.

Solar cells are commonly used to produce electricity from sunlight for specialized applications. However, the general use of solar cells to produce electricity is limited by the cost of making such cells. Currently practical solar cells are of single crystalline structure and are limited in size to the size of single crystal wafers that can be grown. Most solar cells in use are between two and six inches in diameter and arranged in arrays of cells in order to produce the required output of electricity for a particular application. However, since the use of the cells are limited by the size of single crystal wafers available, such cells are limited to a maximum size of about ten inches in diameter. Large area cells, such as cells of four by eight feet could produce substantial amounts of electricity if such large area sheets could be manufactured with single crystalline structure and could be manufactured at reasonable cost.

U.S. Pat. No. 4,102,767 discloses a method for producing single crystal silicon for use in solar cells by liquefying the silicon in an arc furnace and depositing the liquid silicon on a sloping surface to form a polycrystalline sheet. The polycrystalline sheet is passed through a narrow reheating zone where it is heated by a focused line heat source such as an electron beam or laser beam. At a point near the solidification of the reheated liquid silicon, a seed crystal is used along with directional solidification techniques to form the sheet into a single crystal. The size of the sheets contemplated by this process was not indicated.

U.S. Pat. No. 4,131,659 describes the manufacture of large polycrystalline silicon sheets for use as solar cells by the gaseous disposition of silicon on a graphite substrate, melting the silicon on the graphite such as in a narrow zone across the sheet, doping the silicon, and separating the silicon sheet from the substrate. The patent indicates, however, that such sheets only have up to about 10% effectiveness as solar cells.

SUMMARY OF THE INVENTION

According to the invention, a single crystal silicon sheet is manufactured by mixing silicon powder with a binder and a solvent to form a slurry. The slurry is spread on a flat surface to form a uniform layer of silicon slurry of desired size, such as a four foot by eight foot sheet. The material is allowed to dry to remove the solvent or solvents. The dried sheet is then moistened with water which causes it to expand and sheer clear of the surface. The sheet is self supporting and preferably placed in a frame which holds the sheet around the outside edges. The sheet is heated to a temperature to remove the binder. The temperature is then increased to near the melting temperature of the silicon. The sheet is then converted into a single crystal by further heating a small melt area in the sheet and touching the melted silicon with a single crystal tip or wedge. The single crystal causes the melted silicon to take on a single crystallographic orientation. The melt area is moved from its initial position substantially throughout the sheet to simulate zone refining. This causes the entire sheet to take on a single crystal structure and moves the impurities to the edges of the sheet. The sheet is allowed to cool and the edges with impurities removed to form a sheet of single crystal silicon.

In a preferred form of the invention, the silicon powder (the powder particles preferably having a diameter no greater than 10% of the sheet thickness) is mixed with isobutyl methacrylate as a binder and with a solvent of about 70% to about 80% ethylene dichloride and about 30% to about 20% carbon tetrachloride to form a slurry. The slurry is spread on a flat surface to form a layer of substantially uniform thickness. The sheet is allowed to dry to remove the solvents and form a flexible sheet. The sheet is then moistened with water which causes the material to expand and sheer clear of the surface. The sheet is placed in a metal frame which holds the sheet about its periphery, holding about the peripheral one-half inch of the sheet. The sheet is heated to about 600° C. to depolymerize and remove the binder.

The sheet is then heated to within about 50° C. to 100° C. of the melting temperature of silicon. This generally will cause at least some sintering of the silicon and form a polycrystalline silicon sheet. While at this temperature a small portion of the sheet is further heated (to about 1400° C.) by a localized heat source such as a radio frequency heater to form a small melted or liquid phase area of silicon. The melted silicon is contacted by a small wedge of single crystal silicon. The wedge acts as a seed crystal and defines the crystallographic orientation of the melted silicon. The melted or liquid phase area is moved slowly from the initial melt area, generally from side-to-side of the sheet with a small forward advance between each side-to-side movement, so that the liquid phase is moved over the entire sheet to similarly orientate the crystal structure of the entire sheet and to move most of the impurities to the edges of the sheet. The sheet is then allowed to cool to room temperature and is removed from the frame. The edges of the sheet where the impurities have been concentrated are broken or cut off leaving a relatively pure, single crystal sheet of silicon of desired large size.

The purification and crystal structure orientation procedure of the invention can be used on various polycrystalline silicon sheets regardless of how formed.

THE DRAWINGS

The best mode presently contemplated for carrying out the invention is illustrated in the accompanying drawings, in which:

FIG. 1 is a perspective view of a sheet of bound silicon powder in a holding frame ready for further processing;

FIG. 2, an enlarged fragmentary vertical section of an edge of the sheet in the frame of FIG. 1;

FIG. 3, a schematic representation of two ovens with a track running therethrough that supports the frames holding the bound silicon powder sheets showing a frame with sheet therein in each of the ovens and a movable local heat source in one of the ovens;

FIG. 4, a top plan view of a sheet of silicon showing a satisfactory pattern of movement of a liquid phase area throughout the sheet to convert the sheet to a single crystalline structure and move impurities to the edges of the sheet; and FIG. 5, a fragmentary vertical section of a sheet of bound silicon on a sheet of support material as an alternative to the support frame of FIGS. 1 and 2.

DETAILED DESCRIPTION OF THE ILLUSTRATED EMBODIMENT

The invention is directed to producing large area sheets of single crystal silicon. The sheets can be made to substantially any desired dimensions and for any desired purpose. Thus, for example, sheets of four feet by eight feet can be made for use as solar cells which can produce higher power (kilowatt range) than the small wafers (fraction of a watt range) currently available.

A large area sheet of silicon can be prepared by combining silicon powder with a binder and a solvent to form a slurry. The diameter of the powder particles should be less than about a third of the desired thickness of the sheet and preferably less than about 10% of the desired thickness of the sheet. The binder is preferably an isobutyl methacrylate, although other polymeric esters of methacrylic acid could also be used such as normal butyl methacrylate or methyl methacrylate. The solvent is preferably a mixture of about 70% to about 80% ethylene dichloride and about 30% to about 20% carbon tetrachloride, although other volatile solvents could be used such as acetylene tetrachloride, acetone, ethyl acetate, benzene, or xylene. Various proportions of ingredients can be used to mix the slurry, the requirement for the slurry merely being that it can be spread and upon drying (evaporation of the solvent) the particles are bound together so a substantially self-supporting sheet is formed.

The slurry is spread to the desired size and thickness on a flat, preferably nonabsorbent surface such as glass, metal, or marble, such as by use of a doctor blade. The surface preferably should be flat to within plus or minus about one/one-hundredth of the thickness of the finished sheet. While the thickness of the finished sheet can vary significantly, for further processing and use as a solar panel, the finished sheet should preferably be about fifty thousands (50/1000) inch thick. Thicker sheets can be used, but there currently appears to be no benefit to thicker sheets. Since the sheet will shrink some in processing, the slurry should be spread somewhat thicker such as between about fifty-five and sixty thousands inch. If desired, walls could be provided on the surface to define the edges of the sheet.

The slurry as spread on the surface is allowed to dry, i.e., the solvent is allowed to evaporate. This is preferably an air dry at room temperature. The sheet is then wet with water, such as by spraying or spreading water thereon. The water causes the sheet to expand slightly. This slight expansion causes the sheet to "sheer clear" of or separate from the surface. Such separation works best when the surface is substantially nonabsorbent. As removed from the surface, the sheet is a thin, flexible sheet of bound silicon powder particles. This sheet is generally self supporting and can be placed in or on a frame or on a processing surface to be held for further processing.

Figure 1:
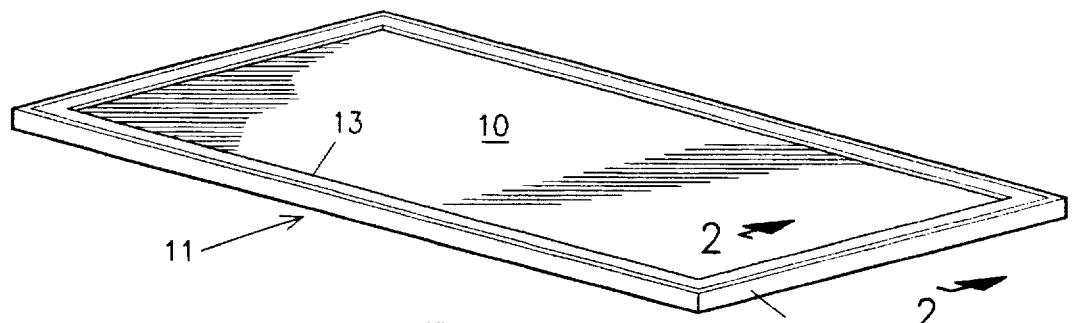
Figure 2:
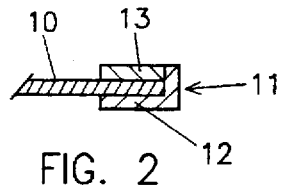

As shown in FIGS. 1 and 2, rectangular sheet 10 is placed and held by gravity in a rectangular metal frame with L-shaped frame member 11 having lower leg 12 of the frame member extending inwardly about one-half inch from the peripheral edges of the sheet to support the sheet in the frame. Various shaped sheets and frames can be used as desired. An upper frame 13 could fit into frame 11 above the edges of sheet 10, if desired, to extend over the upper peripheral about one-half inch of the sheet and more securely hold the sheet in the frame. However, this upper frame generally is not necessary. In the figures the thickness of the sheet has been exaggerated for purposes of illustration. As indicated the sheet will generally be about fifty to sixty thousands inch thick. The frame should be made of a material that will withstand high temperature, and will generally be made of a metal or other rigid material which will withstand temperatures up to at least about 1400° C.

Figure 3:
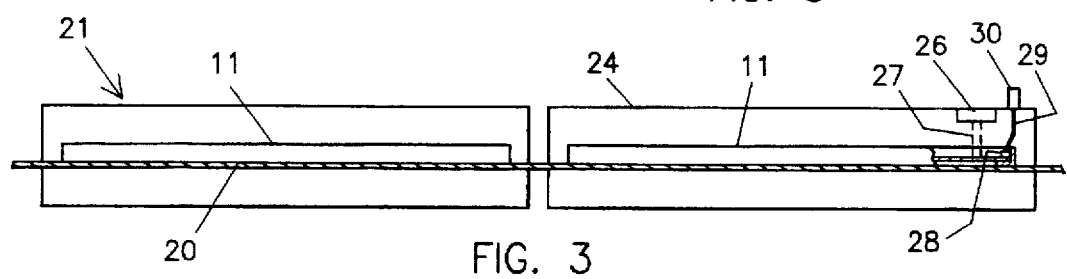

Frame 11 with sheet 10 is placed on track 20 which extends through furnace 21, as shown schematically in FIG. 3. When in the furnace 21, sheet 10 is first heated to a temperature sufficient to depolymerize the binder in the sheet 10 which causes the compounds of the binder to evaporate from the sheet. An inert gas such as nitrogen is circulated through the oven to carry away the gaseous binder components, which may be liquified by cooling such gas outside the furnace. The temperature for the first heating will generally be about 600° C.

After holding the temperature of the oven at the depolymerizing temperature for a time sufficient to completely depolymerize the binder and remove it from the sheet, the temperature in the oven is increased, or for a production line, frame 11 is moved along rail 20 into a second oven 24, where the sheet is heated to a temperature near the melting temperature of silicon, about 1400° C. The temperature in the oven will not reach the melting temperature, preferably being about 50° to 100° below the melting temperature of silicon or between about 1300° C. and about 1350° C. This temperature will generally be sufficient to cause at least some sintering of the silicon particles in the sheet but such sintering is not necessary.

Figure 4:
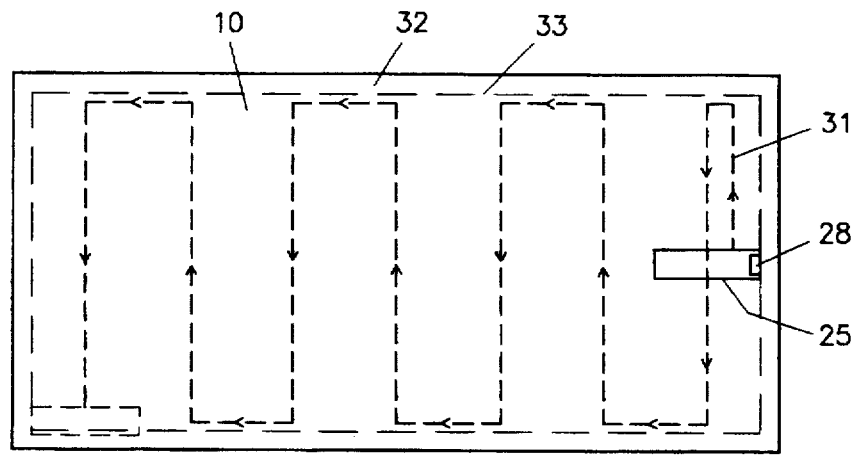

With the sheet at the temperature of oven 24, a relatively small portion of the sheet, illustrated schematically as 25 in FIG. 4, is further heated by a source 26, FIG. 3, of localized heat to melt portion 25. Since sheet 10 in this embodiment is only supported along its edges, the size of melted portion 25 will be limited to an area no larger than that which will be supported in the sheet by surface tension so the molten silicon remains in position in the sheet and does not flow therefrom. A relatively narrow, elongate portion will generally be used, as shown at 25 in FIG. 4, but shown exaggerated in width. An arbitrary initial starting position for the melted portion is shown at 25 in FIG. 4, however, such initial position will generally be along an edge of the sheet as shown.

The heat source may be of various known types such as a radio frequency heat source emitting heating radiation 27 which heats portion 25. Heat source 26 is mounted in known manner, not shown, for two dimensional movement over sheet 10. In its initial location shown as 25, FIG. 4, a silicon seed crystal 28, held in place by bracket 29, touches the molten silicon to establish or define the single crystal crystallographic orientation of the silicon in melt area 25. Seed crystal 28 may be placed in contact with the sheet either before or after melting of the silicon in order to be in contact with the molten silicon upon melting. Mechanism 30, such as a solenoid, may be provided for lowering the seed crystal into contact with the sheet after the sheet is positioned in the oven. After the initial melting, the melt area is slowly moved from the initial location so that the melt area moves contiguously throughout the sheet. This produces a form of zone refining of the silicon in the sheet. As the melted area moves, it moves the impurities in the silicon with it and extends the crystallographic orientation with it from the initial orientation in the initial melt area throughout the area that the melt moves. Thus, if the melt moves from the initial position throughout the entire sheet, the same crystallographic orientation is provided to the entire sheet and the sheet becomes a single crystal of silicon. The pattern of movement of the melt area from the initial location is not critical as long as the melt progresses from the initial location throughout the entire sheet as a continuous or contiguous melting process, i.e., the melted area does not skip from location to location but moves in a continuous manner so that as one edge of the melt area is solidifying, the other edge is melting with always a molten area therebetween.

The broken line 31 in FIG. 4 illustrates a movement pattern for the melt area 25 that moves the melt area back and forth along the sheet to move the melt area through substantially the entire sheet. As shown, the melt area on each back and forth movement overlaps slightly the melt area (now solidified) of the prior pass to ensure all areas of the sheet are melted at some time during the process. The edges of the sheet where the sheet is held by the frame are not melted, with the melt moving to about one quarter inch of the frame. The impurities are moved to the edge of the sheet by the movement indicated. The edge portions 32 of the sheet, indicated as outward of broken line 33, collect the impurities and do not become completely single crystal in structure since they are not fully included in the melt.

The movement of the melt area is accomplished by movement of the heat source over the sheet. Thus, heat source 26 is mounted for controlled movement over the sheet 10 in oven 24 in a convention manner and moves over sheet 10 so that the heating therefrom moves the heated and melted area in the desired pattern over sheet 10.

After the melt has moved throughout the sheet, the sheet is removed from the oven and allowed to cool to room temperature. The edges 31 of the sheet that have collected the impurities and have not been completely converted to single crystal structures are then broken or cut off to leave a relatively pure sheet of single crystal silicon. This sheet is then converted into a photoelectric cell using standard procedures for forming photoelectric cells from silicon wafers. For use in making photoelectric cells, it is preferred that the seed crystal be oriented so that a 1 1 1 crystallographic orientation along the surface of the finished silicon sheet be formed. Such orientation is preferred for photocell use because it allows better light penetration through the surface and into the sheet.

Since the edges of the sheet are broken or cut off to produce the desired single crystal sheet, the sheet made by the slurry and then processed as described has to be larger in dimensions than the desired finished sheet. Thus, if the melt area comes to within about one-quarter inch of the frame and the frame supports about the peripheral one-half inch of the sheet, about the peripheral inch or so of the sheet will be broken or cut off. Thus, the initial sheet before processing will have to be at least about two inches (one inch along each side) larger than the desired final sheet.

Figure 5:
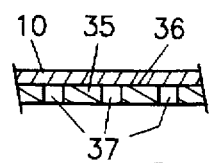

Rather than placing the sheet in a frame as described which allows circulation of heat and gas over both surfaces of the sheet, the sheet could be placed for processing on a sheet of material, such as metal, and moved on such sheet or along such sheet for further processing. Thus, as shown in FIG. 5, the silicon sheet 10, rather than being placed in frame 11 as illustrated in FIGS. 1 and 2, can be placed on processing sheet 35 for support in subsequent heating steps. Sheet 35 could take the place of track 20 through ovens 21 and 24 and silicon sheet 10 slid along sheet 35 through the ovens. Alternately, silicon sheet 10 could be placed on a processing sheet 35 at least as large as silicon sheet 10 and processing sheet 35 with silicon sheet 10 thereon could be moved along track 20 through the furnaces. A layer of powder 36 such as aluminum oxide powder can be placed between sheets 10 and 35 to prevent them from sticking together. Perforations 37 in sheet 35 may be provided to allow circulation of gas, such as nitrogen, along the bottom of sheet 10 particularly during depolymerization of the binder. With this arrangement for support of the silicon sheet 10, the molten silicon in the melt area is better supported than when sheet 10 is in the frame. Thus, a larger melt area may be used. Further, without the frame, processing with the melt area can get closer to the edges of sheet 10 so less of the edges need to be broken off.

While the currently preferred method of making the initial sheet of silicon to be treated and converted to a single crystal sheet from powdered silicon and a binder has been described, it should be realized that polycrystalline sheets made by different methods may be purified and converted to single crystal structure by the creation of a small melt area, contacting that area with a seed crystal, and movement of the small melt area throughout the sheet as described.

Further, while the step of creating the melt area and moving it throughout the sheet is described as taking place in an oven which heats the sheet to within between 50° C. or 100° C. of the melt temperature, and such is currently preferred because it reduces the amount of heating required to be done by the moving localized heater, such as an RF heater, the sheet could be maintained at a lower temperature in the oven, or even maintained at room temperature. In such case, the moving localized heater would have to provide sufficient heat to heat the localized melt area from the sheet temperature to the melt temperature.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. A method of making a large area single crystal silicon sheet, comprising the steps of:

mixing silicon powder with a binder and a solvent to form a silicon slurry;

spreading the slurry in a uniform layer on a flat surface;

drying the layer to remove the solvent;

moistening the layer to cause it to expand and separate from the surface thereby forming a sheet;

heating the sheet to a temperature sufficient to remove the binder therefrom;

heating a localized area of the sheet at an initial location on the sheet to a temperature sufficient to cause the silicon at that location to melt forming a melted area having molten silicon;

contacting the molten silicon at the initial location with a silicon seed crystal to define the crystallographic orientation of the molten silicon;

moving the heated area and resulting melted area contiguously throughout a substantial portion of the sheet to refine that portion of the sheet to form a single crystal structure and move impurities to edges of that refined portion of the sheet;

cooling the sheet; and removing other than the refined portion from the sheet to form the single crystal sheet of silicon.

2. A method of making a large area single crystal silicon sheet according to claim 1, wherein the silicon particles making up the powder having a diameter no greater than about one third the desired thickness of the finished sheet.

3. A method of making a large area single crystal silicon sheet according to claim 2, wherein the diameter of silicon particles making up the powder are no greater than about one-tenth the desired thickness of the finished sheet.

4. A method of making a large area single crystal silicon sheet according to claim 1, wherein the solvent is a mixture of ethylene dichloride and carbon tetrachloride.

5. A method of making a large area single crystal silicon sheet according to claim 4, wherein the ethylene dichloride makes up between about 70% to about 80% of the solvent and carbon tetrachloride makes up the remaining percentage.

6. A method of making a large area single crystal silicon sheet according to claim 1, wherein the surface upon which the slurry is spread is a nonporous surface.

7. A method of making a large area single crystal silicon sheet according to claim 6, wherein the surface is selected from a group of materials consisting of glass, metal, and marble.

8. A method of making a large area single crystal silicon sheet according to claim 1, wherein the layer is moistened with water.

9. A method of making a large area single crystal silicon sheet according to claim 1, wherein the binder is an isobutyl methacrylate.

10. A method of making a large area single crystal silicon sheet according to claim 9, wherein the sheet is heated to a temperature of about 600° C. to remove the binder from the sheet by depolymerization of the binder in the sheet.

11. A method of making a large area single crystal silicon sheet according to claim 10, wherein the step of heating the sheet to depolymerize the binder is carried out in an oven with an inert gas circulating through the oven to remove products of binder depolymerization.

12. A method of making a large area single crystal silicon sheet according to claim 1, including the additional step of heating the sheet to a temperature below the melting temperature of silicon, but above the temperature used to depolymerize the binder, after depolymerization and removal of the binder.

13. A method of making a large area single crystal silicon sheet according to claim 12, wherein the additional step of heating the sheet heats the sheet to between about 1300° C. and about 1350° C.

14. A method of making a large area single crystal silicon sheet according to claim 12, wherein the localized area of the sheet is heated with a localized heat source.

15. A method of making a large area single crystal silicon sheet according to claim 14, wherein the heated area and resulting melted area are moved through the sheet by moving the localized heat source with respect to the sheet.

16. A method of making a large area single crystal silicon sheet according to claim 15, wherein the sheet has edges and the heated area and resulting melted area are moved throughout the sheet to within about three-quarters of an inch of the edges of the sheet.

17. A method of making a large area single crystal silicon sheet according to claim 16, wherein about one inch along the edges of the sheet are removed to remove the impurities and form the single crystal sheet of silicon.

18. A method of making a large area single crystal silicon sheet according to claim 1, wherein the localized area of the sheet is heated with a localized heat source.

19. A method of making a large area single crystal silicon sheet according to claim 18, wherein the heated area and resulting melted area are moved through the sheet by moving the localized heat source with respect to the sheet.

20. A method of making a large area single crystal silicon sheet according to claim 1, wherein the single crystal sheet of silicon is about four feet by eight feet.

21. A large area single crystal silicon sheet made by the method of claim 1.

22. A method of forming a single crystal silicon sheet from a polycrystalline silicon sheet having edges, comprising the steps of:

melting a portion of the sheet at an initial location in the sheet;

defining a single crystallographic orientation for the silicon in the melted portion at the initial location;

moving the melted portion of the sheet from the initial location throughout the sheet to thereby move impurities in the sheet to the edges of the sheet and to extend the crystallographic orientation of the silicon in the sheet substantially throughout the sheet inwardly of the edges of the sheet, whereby a single crystalline structure is formed in the sheet inwardly of the edges; and removing the edges of the sheet containing impurities and any polycrystalline structure to thereby form a silicon sheet of single crystal structure.

* * * * *